(12) United States Patent
Cram

(10) Patent No.: US 6,966,424 B2
(45) Date of Patent: Nov. 22, 2005

(54) BLADDER BASED PACKAGE CONTROL/ SINGULATION

(75) Inventor: Daniel P. Cram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/607,641

(22) Filed: Jun. 26, 2003

(65) Prior Publication Data

US 2004/0055853 A1 Mar. 25, 2004

Related U.S. Application Data

(63) Continuation of application No. 09/847,556, filed on May 2, 2001, now Pat. No. 6,585,097.

(51) Int. Cl.[7] .............................................. B65G 37/00
(52) U.S. Cl. ........................ 198/463.6; 193/32; 193/40
(58) Field of Search ............................... 198/530, 532, 198/463.4, 463.6, 459.7; 193/32, 40, 25 FT, 25 B, 2 R, 4; 221/208, 221

(56) References Cited

U.S. PATENT DOCUMENTS

| | | | |
|---|---|---|---|
| 3,268,048 A | 8/1966 | Noble | |
| 3,603,646 A | 9/1971 | Leoff | |
| 4,058,223 A * | 11/1977 | Cruse ........................... | 193/32 |
| 4,122,934 A * | 10/1978 | Nieto de Moreno .......... | 193/32 |
| 4,573,830 A | 3/1986 | Richardson et al. | |
| 4,706,793 A * | 11/1987 | Masciarelli ................. | 193/35 A |
| 4,801,234 A * | 1/1989 | Cedrone ................... | 198/463.6 |
| 4,946,338 A | 8/1990 | Cutright | |
| 4,968,931 A | 11/1990 | Littlebury et al. | |
| 5,335,810 A * | 8/1994 | Holloway ..................... | 193/32 |
| 6,080,040 A | 6/2000 | Appel et al. | |
| 6,264,415 B1 * | 7/2001 | Boochakorn ............. | 198/459.2 |
| 6,450,322 B1 * | 9/2002 | Beck ........................ | 198/463.6 |
| 6,585,097 B2 * | 7/2003 | Cram .......................... | 193/40 |

FOREIGN PATENT DOCUMENTS

| | | | |
|---|---|---|---|
| DE | 24 44 536 | 4/1976 | |
| DK | 248 763 | 8/1987 | |
| JP | 59-198205 | 11/1984 | |
| JP | 61-169415 | 7/1986 | |
| JP | 62-12504 | 1/1987 | |
| JP | 62-175321 * | 8/1987 | .................. 193/32 |

* cited by examiner

Primary Examiner—James R. Bidwell
(74) Attorney, Agent, or Firm—TraskBritt, PC

(57) ABSTRACT

An apparatus and method for singulating IC devices or semiconductor devices and/or components thereof. The apparatus includes a flexible membrane or bladder configured to receive an applied fluid pressure on a surface thereof and expand in response to the applied fluid pressure. Upon expansion of the flexible membrane, a semiconductor device or semiconductor device component is contacted by the flexible membrane and immobilized. The semiconductor device may then be subjected to a predetermined test or manufacturing operation. Subsequent any processing to the semiconductor device or component, the fluid pressure is released such that the flexible membrane contracts and releases the semiconductor device to be advanced for further processing, testing, or preparation for shipping.

36 Claims, 4 Drawing Sheets

BLADDER BASED PACKAGE CONTROL/SINGULATION

CROSS-REFERENCE TO RELATED APPLICATION

This application is a continuation of application Ser. No. 09/847,556, filed May 2, 2001, now U.S. Pat. No. 6,585,097, issued Jul. 1, 2003.

BACKGROUND OF THE INVENTION

1. Field of the Invention

The present invention relates generally to handling equipment for semiconductor and integrated circuit (IC) devices or semiconductor devices, such as different types of semiconductor die used as microprocessors, memory devices, etc., and the components thereof. More particularly the present invention relates to movement control and singulation of semiconductor devices during a manufacturing or testing process.

2. State of the Art

In the manufacture and testing of semiconductor devices, such as bare semiconductor die or packaged semiconductor die, the semiconductor devices, being either packaged or bare semiconductor die, are transferred through various locations and experience extensive handling. In performing specific tests or particular manufacturing operations, it is often required to separate a single semiconductor device from a plurality of similar semiconductor devices. This act of separation can and may be typically referred to as "singulation." The singulation of a semiconductor device may be accomplished by various means. However, singulation is generally accomplished by implementing an actuating member to stop, advance, or otherwise manipulate a semiconductor device in some manner with respect to one or more adjacent semiconductor devices. The actuating member is often one or more stop members in the form of pins, rods, cams or lever arms motivated by a pneumatic cylinder. In some alternative designs a solenoid or hydraulic cylinder may be employed.

Singulation for semiconductor die marking is one example of isolating a semiconductor device during the manufacturing process. In processing semiconductor devices for semiconductor die marking a plurality of semiconductor devices may be fed to a die marking station by placing them on an inclined track or pathway and feeding them toward the semiconductor die marking station in a serial fashion. Once a semiconductor device enters into a predetermined position on the track, an actuation member, such as a pneumatic cylinder, may then contact the semiconductor device to hold it in a fixed position on the track, or alternatively, the cylinder may move the semiconductor device to a new position and then hold it in place. Once the marking operation has taken place, the cylinder retracts and releases the semiconductor device for further processing, testing or packaging as may be required.

While processing semiconductor devices in such a manner is typically reliable, there are certain inefficiencies associated with such a method. For example, when using mechanical type cylinders, whether they be pneumatic, hydraulic or a solenoid, damage to the individual semiconductor devices is not only a possibility, it is at times a reality. The force of such actuators often mars or leaves marks on the surface of a device and may even cause functional or operational damage in certain instances. Also, in attempting to achieve greater efficiency, the cycle time of such mechanical devices may be increased, which results in greater likelihood of damage due to the rapid deployment and impact with the semiconductor IC device or component. Additionally, such actuators require careful positioning such that contact and, thus, likely damage, is not made with conductive elements of the semiconductor device. Direct and abrupt contact with the conductive elements would likely result in damage thereto possibly rendering the device inoperable. For this reason, actuators are typically positioned to avoid contact with the conductive balls or bumps on a ball grid array (BGA) type device.

Furthermore, pneumatic type cylinders and similar actuators require a certain amount of time to cycle through engagement and retraction, being limited by the high mass of the moving components. Thus, it becomes difficult to improve cyclical times in existing systems even if potential damage from impact of the actuators could be reduced.

In light of the shortcomings of the art, it would be advantageous to provide an apparatus and method for handling and singulating semiconductor devices, or semiconductor device components, which may assist in improving cyclical time of such singulation. It would also be advantageous to provide an apparatus and method that reduces or eliminates damage to the processed devices or components during singulation. Such an apparatus or method may advantageously be utilized in conjunction with various phases or aspects of semiconductor device production including both manufacturing and testing. Additionally, it would be advantageous to provide such an apparatus or method with the ability to contact conductive elements of the semiconductor devices without the risk of damage thereto.

BRIEF SUMMARY OF THE INVENTION

In accordance with one aspect of the invention an apparatus for singulation of semiconductor devices or components thereof is provided. The apparatus includes two plates each having an opening passing therethrough. A flexible membrane is disposed between the two plates with the opening of each plate being substantially aligned with the other. The flexible membrane is configured to receive an applied fluid pressure adjacent the opening in the first plate and to extend outwardly through the opening of the second plate. The flexible membrane is also configured to contact and immobilize a semiconductor device moving adjacent the flexible membrane upon outward extension through the opening of the second plate.

The flexible membrane of the singulating apparatus may be formed of latex, rubber or another suitable material conducive to contacting a semiconductor device without marking or causing physical damage to the device. Use of the flexible material allows the apparatus to contact virtually any surface of the semiconductor device including conductive elements, such as the balls or bumps of a BGA type semiconductor device. The apparatus may also include additional openings to allow for the same membrane, or a separate membrane, to contact the same semiconductor device at a different surface location, to separate the first semiconductor device from a second semiconductor device, or to contact a second semiconductor device. Such a configuration may also be employed such that one flexible membrane contacts and immobilizes a semiconductor device or component while a second flexible membrane subsequently contacts the semiconductor device or component in such a manner so as to reposition it.

In accordance with another aspect of the invention, an apparatus is provided for singulating semiconductor components, such as, for example, die or lead frames. The apparatus includes a flexible membrane that is configured to receive an applied fluid pressure on a surface of the membrane such that it expands and contacts a semiconductor device moving adjacent to the membrane. The membrane serves to temporarily immobilize the semiconductor device component for a predetermined manufacturing or testing operation. As described above, the apparatus may be configured with multiple flexible membranes.

In accordance with another aspect of the present invention, an automated semiconductor device handler is provided. The handler includes an input location for receiving a plurality of semiconductor devices. A pathway, such as a gravity fed track, carries the semiconductor devices as they are advanced from the input location. A flexible membrane is located adjacent the pathway and is configured to receive an applied fluid pressure on a surface of the membrane such that the membrane extends toward and contacts a semiconductor device traveling along the pathway. As with the other aspects of the present invention, various features or techniques may be incorporated with the automated handler for further enhancement, or alternative implementation. For example, the handler may be coupled with a testing station wherein the flexible membrane contacts and immobilizes a semiconductor device in conjunction with the testing of the device. Similarly the handler might be used in conjunction with various manufacturing processes.

In accordance with yet another aspect of the present invention, a method of singulating semiconductor devices is provided. In accordance with the method, a plurality of semiconductor devices are advanced along a predetermined path. A flexible membrane is provided at a location adjacent the predetermined path in anticipation of singulating the semiconductor devices. A fluid pressure is applied to a surface of the membrane to effect an extension or expansion of the membrane towards the path. Upon proper extension or expansion of the membrane, a semiconductor device is contacted and immobilized thereby. The method may further include providing additional membranes. The additional membranes may be operated similarly to that described above for various purposes including physical separation of two or more devices.

In accordance with yet another aspect of the present invention, a method of testing semiconductor devices is provided. According to the method, a plurality of semiconductor devices are advanced along a predetermined path. A flexible membrane is provided at a location adjacent the predetermined path in anticipation of singulating the semiconductor devices. A fluid pressure is applied to a surface of the membrane to effect an extension or expansion of the membrane towards the path. Upon proper extension or expansion of the membrane, a semiconductor device is contacted and immobilized such that the semiconductor device may be subjected to a predetermined test. The fluid pressure is released from the membrane allowing the membrane to retract from and release the semiconductor device in preparation of receiving and testing an additional device.

In accordance with yet another aspect of the present invention, a method of manufacturing a semiconductor device is provided. According to the presently considered method, a plurality of semiconductor devices are advanced along a predetermined path. A flexible membrane is provided at a location adjacent the predetermined path in anticipation of singulating the semiconductor devices. A fluid pressure is applied to a surface of the membrane to effect an extension or expansion of the membrane towards the path. Upon proper extension or expansion of the membrane, a semiconductor device is contacted and immobilized such that the semiconductor device may be subjected to a predetermined manufacturing operation. The fluid pressure is released from the membrane allowing the membrane to retract from and release the semiconductor device in preparation of receiving and performing the manufacturing operation to an additional device.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1A:
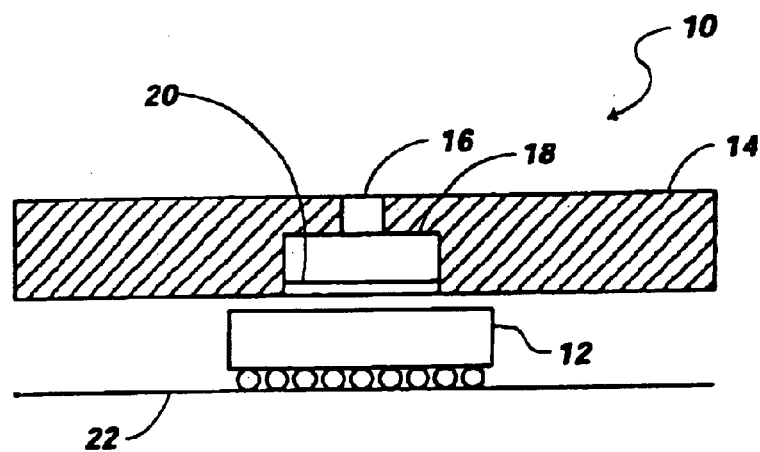
FIGS. 1A–1C show partial sectional views of one embodiment of the present invention during various phases of engagement with an IC device.
Figure 1B:
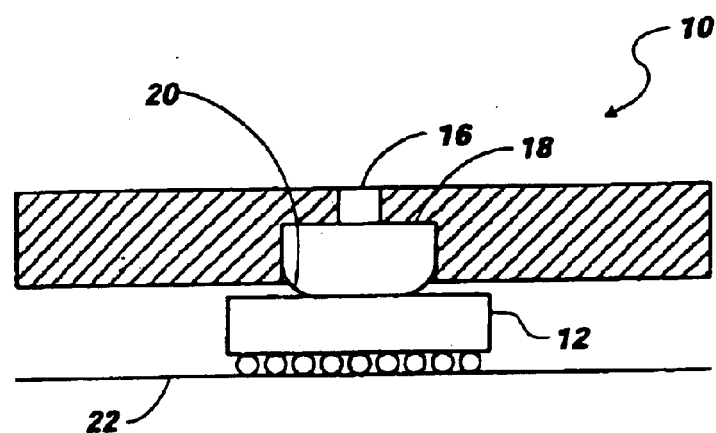
Figure 1C:
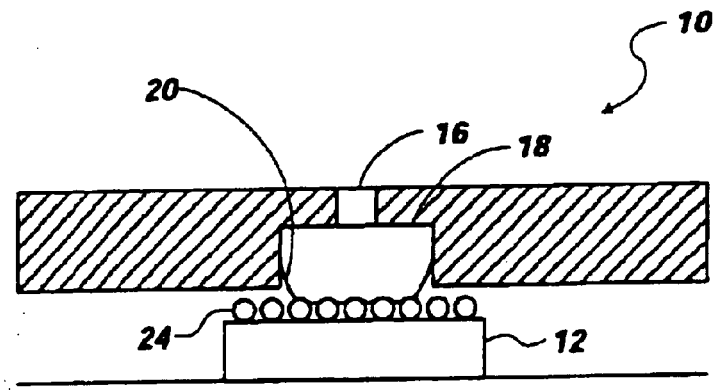

Referring to drawing FIGS. 1A through 1C, an apparatus 10 for singulating or controlling the movement of an integrated circuit (IC) device or semiconductor device 12 is shown. While the semiconductor device 12 is depicted as a ball grid array (BGA) type semiconductor device, the present invention is compatible with numerous types of semiconductor devices as well as semiconductor device components utilized to manufacture the resulting semiconductor device. The apparatus 10 includes a body 14, which is shown in the form of a plate. A first opening 16 is formed in the body 14 and is communicative with a second opening 18 or cavity. The first opening 16 is configured to be coupled with a fluid pressure source such as, for example, a pneumatic or hydraulic supply. The first opening 16 thus may include threads or may be otherwise adapted for various fittings or connections to the fluid pressure source as are known to those of ordinary skill in the art. The second opening 18 has a flexible membrane 20 sealingly coupled thereto. Illustrated in drawing FIG. 1A is the flexible membrane 20 in a relaxed and disengaged position. The flexible membrane 20 remains in the disengaged position until a fluid pressure is supplied to the second opening or cavity 18 via the first opening 16. Upon introduction of a fluid pressure into the cavity 18, a pressure builds against the interior surface of the flexible membrane 20 until a sufficient amount of pressure causes the flexible membrane 20 to expand outwardly from the cavity 18 and towards the semiconductor device 12. Ultimately, the flexible membrane 20 contacts the semiconductor device 12 as shown in drawing FIG. 1B and, upon application of sufficient fluid pressure, immobilizes the semiconductor device 12 by pressing it against an opposing surface 22 such as a track or pathway adjacent the apparatus 10.

Referring to drawing FIG. 1C, the apparatus 10 is shown with the flexible membrane 20 expanded or actuated and with the semiconductor device 12 shown in an alternative orientation. The semiconductor device 12 is oriented with the conductive elements 24, in this case the conductive bumps or balls, exposed to the flexible membrane 20. Thus the flexible membrane 20 actually contacts the conductive elements 24 while pressing the semiconductor device 12 and holding it against the opposing surface 22. The use of a flexible membrane 20 in contacting and immobilizing a semiconductor device 12 allows for sufficient stopping and holding power in controlling the movement of the semiconductor device 12, while minimizing, if not eliminating, the risk of damage to the semiconductor device 12. Such an apparatus 10 allows for various orientations of the semiconductor device 12 regarding its relative position with respect to the flexible membrane 20. Additionally, the apparatus 10 prevents damage even during rapid deployment of the flexible membrane 20 since the flexible membrane will conform to the surface of the semiconductor device 12 with which it makes contact.

The flexible membrane 20 shown in the above described embodiments, as well as those discussed below herein, may be formed of a latex material. Latex exhibits desirable properties of durability and a high degree of elasticity. However, other flexible materials such as various polymers and rubbers may be suitable for use in the presently described invention. Where the apparatus 10 may be utilized in areas of high temperature, such as, for example, in conjunction with burn-in testing of a semiconductor die or a semiconductor device, it may be desirable to form the flexible membrane 20 from a silicone based material in order to avoid premature deterioration of the membrane 20.

Figure 2A:
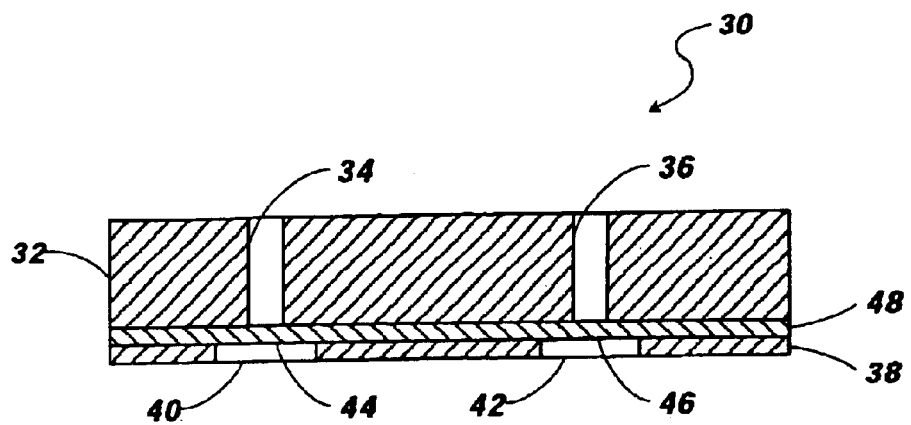
FIGS. 2A and 2B show partial sectional views of an alternative embodiment of the present invention.
Figure 2B:
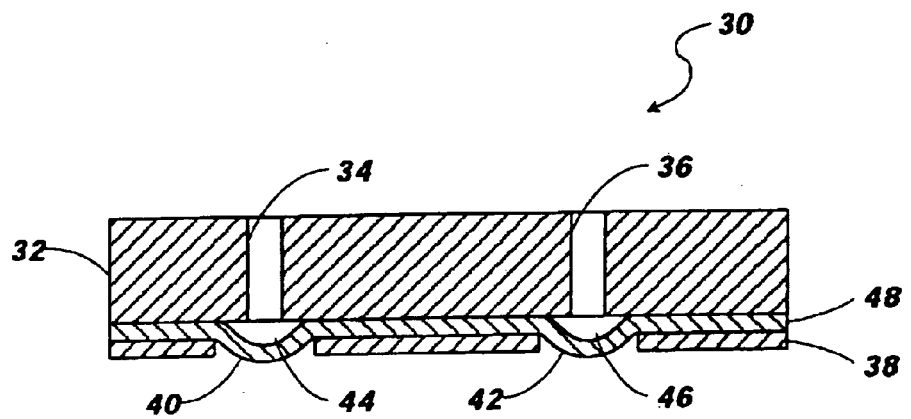

Referring to drawing FIGS. 2A and 2B an alternative embodiment of the present invention is shown. An apparatus 30 is shown for singulating or controlling the movement of a semiconductor device (not shown). The apparatus 30 includes a first plate 32 having a first and second opening 34 and 36 therethrough. The openings 34 and 36 are configured to be coupled with a fluid pressure source and thus may be adapted to receive various fittings or couplings therein. A second plate 38 also includes a first and second opening 40 and 42 therethrough, which shall be referred to as apertures for sake of clarity. The apertures 40 and 42 are generally aligned with the openings 34 and 36, respectively. A first and a second flexible membrane 44 and 46 are sandwiched between the two plates 32 and 38 and a portion of each is exposed to the openings 34 and 36 as well as the apertures 40 and 42, respectively. It is noted that while the flexible membranes 44 and 46 are designated as individual components, they are actually shown to be formed of single sheet or film of material 48. Such designation of separate membranes 44 and 46 is used for convenience in describing the individual components, but also indicates that separate and individual sheets or films of material could be placed between the two plates 32 and 38 so long as the material was oriented in a sealed manner between the openings 34 and 36 and the apertures 40 and 42 to properly form the membranes 44 and 46, respectively. Likewise, while both plates 32 and 38 are shown as unitary members, either may be formed of multiple components. For example, the second or bottom plate 38 may be formed of separate flange members, each having an opening therethrough, and each serving to seal the flexible membrane adjacent its respective opening.

As shown in drawing FIG. 2B, the flexible membranes 44 and 46 expand outwardly upon introduction of a fluid pressure via the openings 34 and 36. Such outward expansion allows the membranes to extend toward a semiconductor device (not shown) located adjacent the apertures 40 and 42 and contact the semiconductor device to immobilize it for a predetermined purpose similar as described above.

The two openings 34 and 36 may be connected to a common fluid source such that they operate simultaneously and synchronously, or, in the alternative, the openings may have independent controls associated with the introduction of a fluid pressure to each. Thus, each membrane, if so desired may be operated independently of the other to assist in singulating and controlling the movement of one or more of a plurality of semiconductor devices. The embodiment illustrated in drawing FIGS. 2A and 2B provides the advantage of simplified maintenance. For example, if one of the flexible membranes 44 or 46 should rupture or leak at any time, replacement is effected rather simply by disassembling the two plates 32 and 38 and replacing the membrane 44 or 46.

Figure 3A:
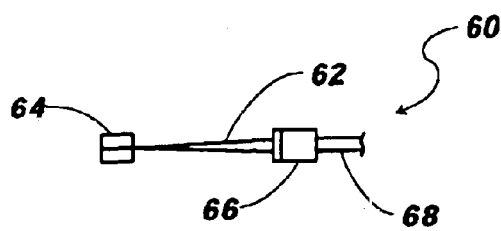
FIGS. 3A and 3B show an elevational view of an alternative embodiment of the present invention.
Figure 3B:
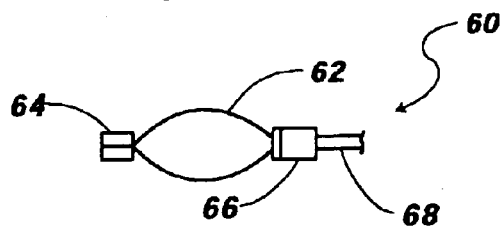

Referring to drawing FIGS. 3A and 3B, another alternative embodiment of an apparatus 60 for singulating semiconductor devices or semiconductor device components is depicted. The apparatus includes a bladder 62 formed of a flexible material such as the flexible membranes discussed above. The bladder 62 is held, at one end, by a clamping mechanism 64. The clamping mechanism 64 serves to hold one end of the bladder 62 in fixed position, and may cause the bladder 62 to be in a relatively low state or tension when in a disengaged or empty status as depicted in drawing 3A. The clamping mechanism 64 may also be used to seal an open end of the bladder 62 depending on the particular construction of the bladder 62. The second end of the bladder 62 is sealingly connected with a coupling or fitting 66 to accommodate the introduction of a fluid pressure into the interior of the bladder 62. The coupling 66 is connected to a fluid pressure source (not shown) via tubing 68 or a similarly adequate structure. Upon introduction of fluid pressure into the bladder 62 via the tubing 68 and coupling 66, the bladder 62 expands outwardly as shown in drawing FIG. 3B. The bladder 62 expands sufficiently to contact and immobilize a semiconductor device, or a semiconductor device component passing thereby. The use of the apparatus 60 shown in drawing FIGS. 3A and 3B allows for installation in areas where space is limited or where a compact design is required. Such a design might allow for easier modification or retrofit or existing machinery and device handlers.

Figure 4A:
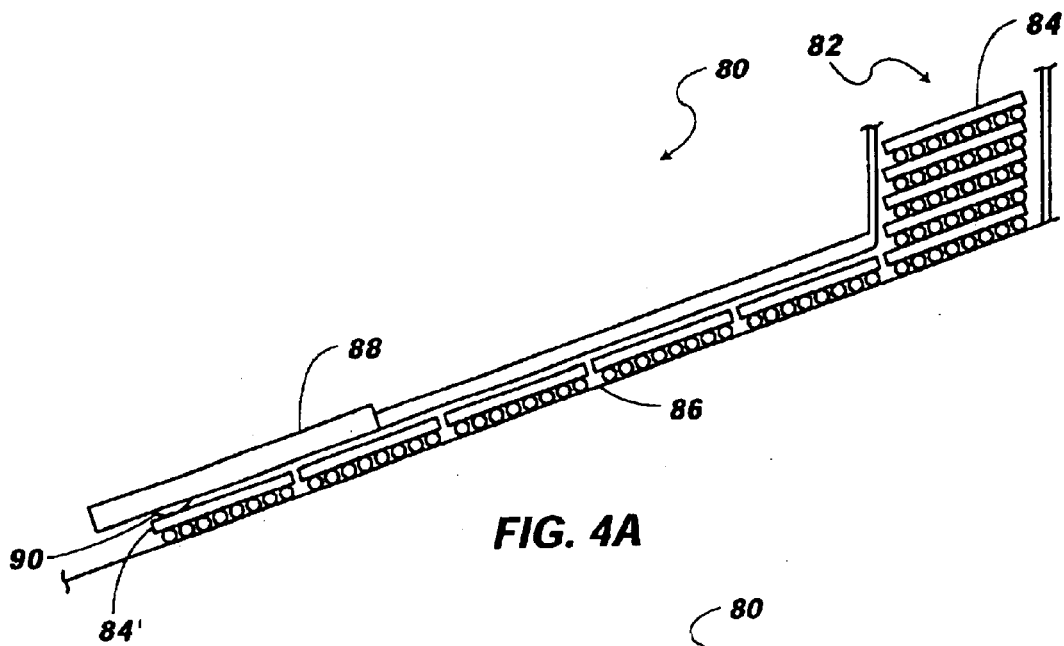
FIGS. 4A–4C show an elevational view of singulating mechanism according to one aspect of the present invention.
Figure 4B:
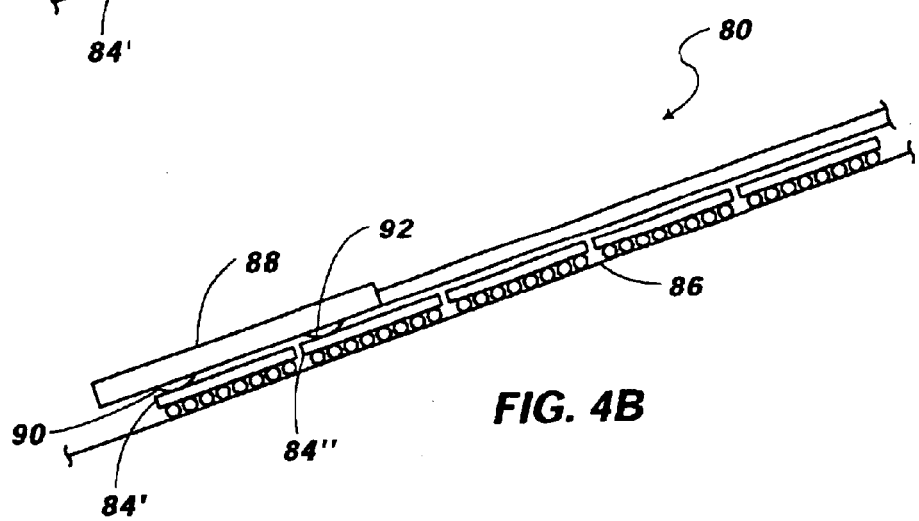
Figure 4C:
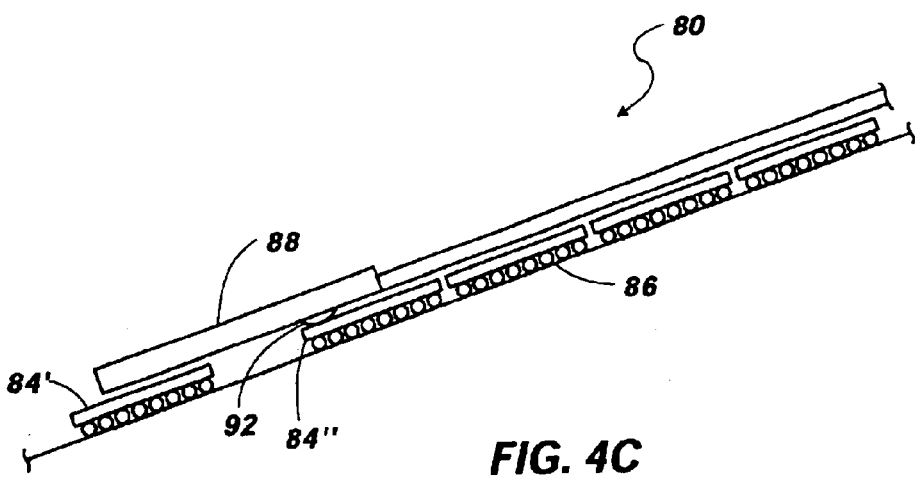

Referring now to drawing FIGS. 4A through 4C a portion of automated handler 80 is shown wherein flexible membranes or bladders, similar to those described above, are employed. The handler 80 includes an input location 82, such as a hopper or magazine, for loading a plurality of semiconductor devices 84. The semiconductor devices 84 dispense serially onto an inclined track 86 that feeds the semiconductor devices to a singulation device 88 such as by means of gravity. As the semiconductor devices 84 pass along the track 86 adjacent the singulation device 88, a flexible membrane or bladder 90, similar to that described above, is actuated such that it contacts and immobilizes the semiconductor device 84' furthest down the track 86 as seen in drawing FIG. 4A. Immobilization of the semiconductor device 84' adjacent the singulation device 88 also causes all of the upstream semiconductor devices to stop as well. A second flexible membrane or bladder 92 then engages the semiconductor device 84" directly adjacent and upstream from the first immobilized semiconductor device 84' as shown in drawing FIG. 4B. Thereafter, the first flexible membrane 90 is disengaged allowing the first semiconductor device 84' to advance while the remaining semiconductor devices 84 are held in place by the immobilization of the second semiconductor device 84" via the second flexible membrane 92. While stopped by the first flexible membrane 90, the first semiconductor device 84' may be subjected to a testing or manufacturing process. Or alternatively, following the release of the first semiconductor device 84', it may be stopped by a third flexible membrane (not shown) at a predetermined distance down the track 86 to be subjected to a specified manufacturing or testing process. Subsequent the release of the first semiconductor device 84', the second semiconductor device 84" may be released and advanced until it is contacted and immobilized by the first flexible membrane 90 and the cycle will continue.

Figure 5A:
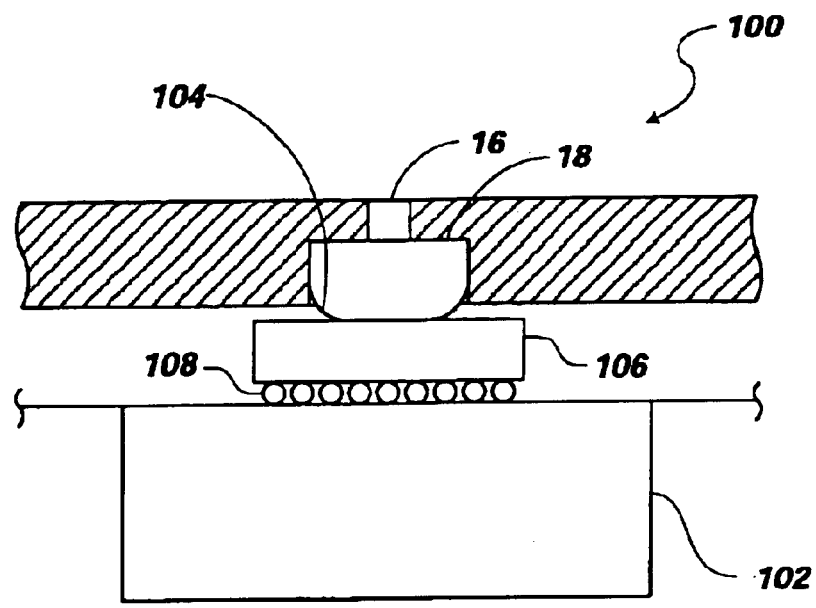
FIGS. 5A and 5B show partial sectional views of an alternative embodiment of the present invention.

Referring to drawing FIG. 5A, a singulating apparatus or device 100 is shown in conjunction with a testing device 102. The singulating device 100 employs a flexible membrane or bladder 104 to singulate a semiconductor device 106 as described above. The semiconductor device 106 is then subjected to a test or a series of tests conducted via the testing device 102. For example, the testing device 102 might include an apparatus that engages with a plurality of conductive elements 108 through which the internal circuitry may be tested. Alternatively, the testing device 102 may include componentry used to test the integrity of soldered joints. Similarly, other various tests may be performed upon the semiconductor device 106 subsequent singulation as known and understood by those of ordinary skill in the art.

Figure 5B:
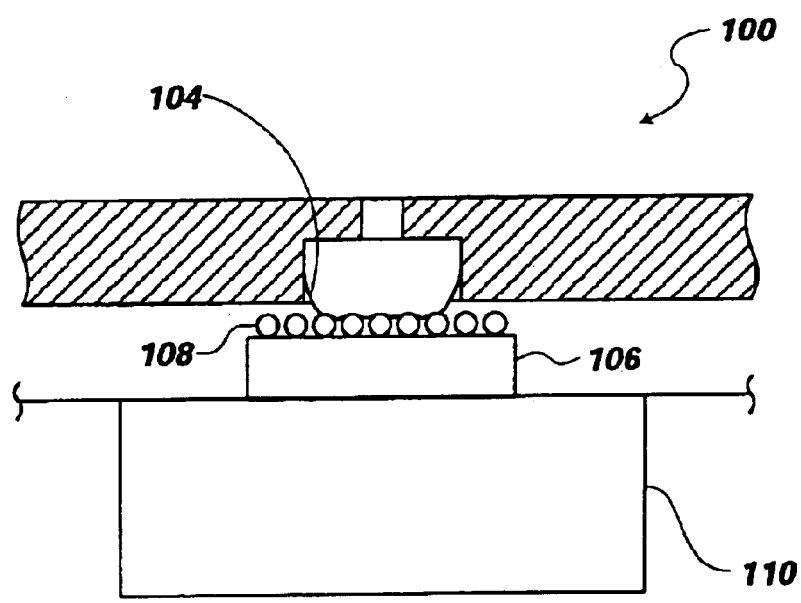

Referring to drawing FIG. 5B, the singulation apparatus 100 is shown to be used with a manufacturing or processing apparatus 110. The semiconductor device 106 is inverted as compared to that shown in drawing FIG. 5A and the flexible membrane 104 is shown to be contacting a plurality of the conductive elements 108 on the semiconductor device 106. With the semiconductor device 106 oriented as shown in drawing FIG. 5B, a manufacturing process such as marking or demarking the semiconductor device 106 may be carried out. For example, the processing apparatus 110 may be a laser marking apparatus used to mark the semiconductor device 106 during singulation. Likewise, similar manufacturing steps may be carried out in a like manner. Also, multiple bladders may be strategically positioned to motivate or reposition a semiconductor device or component into a desired position.

It is noted that the various described embodiments may be combined in various forms in implementation, and that such descriptions have been exemplary and should not be considered as limiting. For example, the flexible membrane or bladder of any of the above described embodiments need not contact the major surface of a semiconductor device or component thereof to effect singulation. Rather, such bladders may be used to effect singulation by contacting a minor surface, such as the relatively thin side or edge of a device. Similarly, the bladders may be used to separate a first device from a second device. Additionally, multiple bladders may be used to contact a single device including contact on opposing sides of the device or component.

Thus, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor device handling apparatus comprising:
    a first plate having a first opening therethrough;
    a second plate having a first opening therethrough, the first opening of the second plate being substantially aligned with the first opening of the first plate; and
    a first flexible membrane disposed between the first and second plates for receiving a first fluid pressure adjacent the first opening of the first plate for causing the first flexible membrane to extend outwardly through the first opening of the second plate to immobilize at least one semiconductor device moving adjacent thereto by the first flexible membrane having a portion thereof substantially conforming to a surface of the at least one semiconductor device, the surface of the at least one semiconductor device including one surface of a surface having conductive elements thereon and a surface opposite a surface having conductive elements thereon.

2. The apparatus according to claim 1, wherein the first flexible membrane comprises one of latex and a rubber.

3. The apparatus according to claim 1, wherein the first flexible membrane is configured to contact at least one of a plurality of conductive elements on the at least one semiconductor device.

4. The apparatus according to claim 1, further comprising a second opening in the first plate substantially aligned with a second opening in the second plate wherein a second flexible membrane is disposed between the first and second plates and configured to receive a second fluid pressure adjacent the second opening of the first plate and to extend outwardly through the second opening of the second plate to contact and immobilize at least one other semiconductor device moving adjacent to the second flexible membrane.

5. The apparatus according to claim 1, further comprising a second opening in the first plate substantially aligned with a second opening in the second plate wherein a second flexible membrane is disposed between the first and second plates and configured to receive a second fluid pressure adjacent the second opening of the first plate and to extend outwardly through the second opening of the second plate to contact at least one other semiconductor device.

6. The apparatus according to claim 5, wherein the second flexible membrane is configured to reposition the at least one other semiconductor device upon contact therewith.

7. The apparatus of claim 1, wherein the first flexible membrane is further configured to separate the at least one semiconductor device from at least one other semiconductor device.

8. The apparatus of claim 1, wherein the first flexible membrane is configured to extend outwardly at an angle substantially perpendicular with a planar surface of the second plate.

9. The apparatus of claim 1, wherein the first flexible membrane is configured to extend outwardly at an angle not perpendicular with a planar surface of the second plate.

10. A handling apparatus for handling IC components comprising:
    a first flexible membrane configured to receive an applied fluid pressure on a surface thereof and to expand to contact and immobilize at least one IC component moving adjacent thereto by the first flexible membrane having a portion thereof substantially conforming to a surface of the at least one IC component, the surface of the at least one IC component including one surface of a surface having conductive elements thereon and a surface opposite a surface having conductive elements thereon; and
    a second flexible membrane configured to receive an applied fluid pressure on a surface thereof and to expand to contact and immobilize at least one other IC component moving adjacent to the second flexible membrane by the second flexible membrane having a portion thereof substantially conforming to a surface of the at least one other IC component, the surface of the at least one IC component including one surface of a surface having conductive elements thereon and a surface opposite a surface having conductive elements thereon.

11. The apparatus according to claim 10, wherein the first flexible membrane comprises one of latex and rubber.

12. The apparatus according to claim 10, wherein the second flexible membrane is configured to contact at least one of a plurality of conductive elements located on the at least one other IC component.

13. The apparatus according to claim 10, wherein the second flexible membrane is configured to receive a second applied fluid pressure on a surface thereof and to expand to contact the at least one other IC component.

14. The apparatus according to claim 13, wherein the second flexible membrane is configured to separate at least two IC components.

15. The apparatus of claim 10, wherein the first flexible membrane is further configured to separate the at least one IC component from the at least one other IC component.

16. An IC device handler comprising:
an input location for receiving a plurality of IC devices;
a pathway along which the IC devices are advanced from the input location;
a first flexible membrane to receive an applied fluid pressure on a surface thereof and to contact at least one of the plurality of IC devices to stop the advancement thereof by the first flexible membrane having a portion thereof substantially conforming to a surface of an IC device, the surface of the IC device including one surface of a surface having conductive elements thereon and a surface opposite a surface having conductive elements thereon; and
a second flexible membrane configured to receive an applied fluid pressure on a surface thereof and to contact at least one of the plurality of IC devices to stop the advancement thereof by the second flexible membrane having a portion thereof substantially conforming to a surface of another IC device, the surface of the another IC device including one surface of a surface having conductive elements thereon and a surface opposite a surface having conductive elements thereon.

17. The handler of claim 16, wherein the pathway comprises a gravity fed track.

18. The handler of claim 16, further comprising a processing station adjacent the first flexible membrane wherein the plurality of IC devices are advanced through the processing station via the pathway.

19. The handler of claim 16, wherein the processing station includes at least one of a testing device and a die marking device.

20. An automated IC device handler comprising:
an input location for receiving a plurality of IC devices;
a pathway along which the IC devices are advanced from the input location;
a first flexible membrane configured to receive an applied fluid pressure on a surface thereof and to contact at least one of the plurality of IC devices to stop the advancement of the at least one of the plurality of IC devices by the first flexible membrane having a portion thereof substantially conforming to a surface of an IC device, the surface of the IC device including one surface of a surface having conductive elements thereon and a surface opposite a surface having conductive elements thereon; and
a second flexible membrane configured to receive an applied fluid pressure on a surface thereof and to contact at least one other of the plurality of IC devices to stop the advancement of the at least one other of the plurality of IC devices by the second flexible membrane having a portion thereof substantially conforming to a surface of another IC device, the surface of the another IC device including one surface of a surface having conductive elements thereon and a surface opposite a surface having conductive elements thereon.

21. The handler of claim 20, further comprising a processing station adjacent the first flexible membrane wherein the plurality of IC devices are advanced through the processing station via the pathway.

22. The handler of claim 20, wherein the processing station includes at least one of a testing device and a die marking device.

23. A method of handling IC devices comprising:
advancing a plurality of IC devices along a predetermined path;
providing a first flexible membrane adjacent the predetermined path;
providing a second flexible membrane adjacent the predetermined path;
applying a fluid pressure to a surface of the first flexible membrane such that the first flexible membrane extends towards the predetermined path;
contacting at least one of the plurality of IC devices with the first flexible membrane and immobilizing the at least one of the plurality of IC devices, the first flexible membrane having a portion thereof substantially conforming to a surface of an IC device, the surface of the IC device including one surface of a surface having conductive elements thereon and a surface opposite a surface having conductive elements thereon; and
applying a fluid pressure to a surface of the second flexible membrane such that the second flexible membrane extends towards the predetermined path.

24. The method of claim 23, wherein contacting the at least one of the plurality of IC devices includes contacting at least one of a plurality of conductive elements located on the at least one of the plurality of IC devices.

25. The method of claim 23, wherein providing the first flexible membrane includes a first and a second flexible membrane.

26. The method of claim 25, further comprising contacting at least one other of the plurality of IC devices with the second flexible membrane.

27. The method of claim 23, wherein applying the fluid pressure to the surface of the first flexible membrane comprises applying a fluid pressure to the surface of the first flexible membrane for contacting and immobilizing the at least one of the plurality of IC devices and wherein the method further comprises applying the fluid pressure to the surface of the second flexible membrane such that the second flexible membrane contacts and repositions the at least one of the plurality of IC devices subsequent to the immobilization thereof.

28. The method of claim 27, further comprising releasing the applied fluid pressure.

29. The method of claim 27, further comprising advancing the at least one of the plurality of IC devices along the predetermined path and away from the first flexible membrane subsequent to release of the applied fluid pressure.

30. The method of claim 29, further comprising reapplying fluid pressure to the surface of the first flexible membrane and contacting and immobilizing at least one other of the plurality of IC devices subsequent to the release of the applied fluid pressure.

31. A semiconductor device handling apparatus comprising:
- a plate having a first opening therethrough; and
- a first flexible membrane attached to a portion of the plate adjacent the first opening for receiving a first fluid pressure adjacent the first opening of the first plate for causing the first flexible membrane to extend outwardly to immobilize at least one semiconductor device moving adjacent thereto by the first flexible membrane having a portion thereof substantially conforming to a surface of the at least one semiconductor device, the surface of the at least one semiconductor device including one surface of a surface having conductive elements thereon and a surface opposite a surface having conductive elements thereon.

32. The apparatus according to claim 31, wherein the first flexible membrane comprises one of latex and rubber.

33. The apparatus according to claim 31, wherein the first flexible membrane is configured to contact at least one of a plurality of conductive elements on the at least one semiconductor device.

34. The apparatus according to claim 31, further comprising a second opening in the plate having a second flexible membrane attached adjacent thereto to receive a second fluid pressure adjacent the second opening of the first plate to extend outwardly through the second opening of the second plate to contact and immobilize at least one other semiconductor device moving adjacent to the second flexible membrane.

35. The apparatus according to claim 34, wherein the second flexible membrane is configured to reposition the at least one other semiconductor device upon contact therewith.

36. The apparatus of claim 31, wherein the first flexible membrane is further configured to separate the at least one semiconductor device from at least one other semiconductor device.

* * * * *

UNITED STATES PATENT AND TRADEMARK OFFICE
CERTIFICATE OF CORRECTION

PATENT NO. : 6,966,424 B2 Page 1 of 1
APPLICATION NO. : 10/607641
DATED : November 22, 2005
INVENTOR(S) : Daniel P. Cram It is certified that error appears in the above-identified patent and that said Letters Patent is hereby corrected as shown below:

In the specification:
COLUMN 4, LINE 22, change "view of singulating" to --view of a singulating--
COLUMN 5, LINE 47, change "of single" to --of a single--

In the claims:
CLAIM 2, COLUMN 8, LINE 17, change "and a rubber." to --and rubber.--

Signed and Sealed this

Fourth Day of December, 2007

JON W. DUDAS
*Director of the United States Patent and Trademark Office*